(12) United States Patent
Dennison et al.

(10) Patent No.: US 7,282,447 B2
(45) Date of Patent: Oct. 16, 2007

(54) METHOD FOR AN INTEGRATED CIRCUIT CONTACT

(75) Inventors: Charles H Dennison, Meridian, ID (US); Trung T. Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/923,060

(22) Filed: Aug. 19, 2004

(65) Prior Publication Data

US 2005/0020090 A1  Jan. 27, 2005

Related U.S. Application Data

(60) Division of application No. 10/136,544, filed on May 1, 2002, which is a continuation of application No. 09/569,578, filed on May 10, 2000, now Pat. No. 6,414,392, which is a division of application No. 09/099,047, filed on Jun. 17, 1998, now Pat. No. 6,221,779, which is a continuation of application No. 08/786,482, filed on Jan. 21, 1997, now Pat. No. 5,858,877, which is a continuation of application No. 08/626,651, filed on Apr. 1, 1996, now Pat. No. 5,651,855, which is a continuation of application No. 08/259,187, filed on Jun. 13, 1994, now abandoned, which is a continuation-in-part of application No. 07/921,320, filed on Jul. 28, 1992, now abandoned.

(51) Int. Cl.
*H01L 21/461* (2006.01)
*H01L 21/302* (2006.01)

(52) U.S. Cl. ............ 438/689; 438/736; 438/725; 438/634; 438/690; 438/734; 438/735; 438/737; 438/738; 438/739; 438/740; 216/47; 257/E21.49

(58) Field of Classification Search ............ 438/689, 438/736, 725; 216/47
See application file for complete search history.

(56) References Cited

U.S. PATENT DOCUMENTS 3,653,898 A  4/1972  Shaw (Continued)

FOREIGN PATENT DOCUMENTS

| EP | 463365 A2 | 1/1992 |
|----|-----------|--------|
| JP | 2-292818  | 12/1990 |
| JP | 2-292819  | 12/1990 |
| JP | 03-087030 | 4/1991 |
| JP | 03-230548 | 10/1991 |

OTHER PUBLICATIONS

Yeh, J.L., et al., "Reverse-pillar--a self-aligned and self-planarised metallisation scheme for sub-micron technology," Vacuum, vol. 38, Nos. 8-10, pp. 817-821, 1988.

(Continued)

*Primary Examiner*—Michael Lebentritt
*Assistant Examiner*—Mohsen Ahmadi
(74) *Attorney, Agent, or Firm*—TraskBritt

(57) ABSTRACT

A process is provided for forming vertical contacts in the manufacture of integrated circuits and devices. The process eliminates the need for precise mask alignment and allows the etch of the contact hole to be controlled independent of the etch of the interconnect trough. The process includes forming an insulating layer on the surface of a substrate; forming an etch stop layer on the surface of the insulating layer; forming an opening in the etch stop layer; etching to a first depth through the opening in the etch stop layer and into the insulating layer to form an interconnect trough; forming a photoresist mask on the surface of the etch stop layer and in the trough; and continuing to etch through the insulating layer until reaching the surface of the substrate to form a contact hole. The process may be repeated during the formation of multilevel metal integrated circuits.

20 Claims, 5 Drawing Sheets

U.S. PATENT DOCUMENTS

| | | | |
|---|---|---|---|
| 3,660,735 A | 5/1972 | McDougall | |
| 3,728,167 A | 4/1973 | Garber | |
| 3,904,454 A | 9/1975 | Magdo et al. | |
| 3,961,414 A | 6/1976 | Humphreys | |
| 4,135,954 A | 1/1979 | Chang et al. | |
| 4,243,435 A | 1/1981 | Barile et al. | |
| 4,377,438 A | 3/1983 | Moriya et al. | |
| 4,671,849 A | 6/1987 | Chen et al. | |
| 4,696,097 A | 9/1987 | McLaughlin et al. | |
| 4,832,789 A | 5/1989 | Cochran et al. | |
| 4,837,176 A | 6/1989 | Zdebel et al. | |
| 4,883,767 A | 11/1989 | Gray et al. | |
| 4,962,058 A | 10/1990 | Cronin et al. | |
| 4,997,789 A | 3/1991 | Keller et al. | |
| 5,055,423 A | 10/1991 | Smith et al. | |
| 5,055,426 A | 10/1991 | Manning | |
| 5,091,339 A | 2/1992 | Carey | |
| 5,093,279 A | 3/1992 | Andreshak et al. | |
| 5,106,780 A | 4/1992 | Higuchi | |
| 5,126,006 A * | 6/1992 | Cronin et al. | 438/702 |
| 5,136,124 A | 8/1992 | Cronin et al. | |
| 5,169,802 A | 12/1992 | Yeh | |
| 5,173,442 A | 12/1992 | Carey | |
| 5,189,506 A | 2/1993 | Cronin et al. | |
| 5,204,286 A | 4/1993 | Doan | |
| 5,206,187 A | 4/1993 | Doan et al. | |
| 5,219,787 A | 6/1993 | Carey et al. | |
| 5,258,328 A | 11/1993 | Sunada et al. | |
| 5,294,561 A | 3/1994 | Tanigawa | |
| 5,312,518 A | 5/1994 | Kadomura | |
| 5,312,777 A | 5/1994 | Cronin et al. | |
| 5,330,934 A | 7/1994 | Shibata et al. | |
| 5,354,711 A * | 10/1994 | Heitzmann et al. | 438/638 |
| 5,423,945 A | 6/1995 | Marks et al. | |
| 5,612,254 A | 3/1997 | Mu et al. | |
| 5,651,855 A * | 7/1997 | Dennison et al. | 438/628 |
| 5,682,044 A * | 10/1997 | Tamamushi et al. | 257/147 |
| 5,858,877 A * | 1/1999 | Dennison et al. | 438/700 |
| 5,880,037 A | 3/1999 | Arleo | |
| 6,221,779 B1 | 4/2001 | Dennison et al. | |
| 6,399,514 B1 | 6/2002 | Marks et al. | |
| 6,420,272 B1 | 7/2002 | Shen et al. | |
| 6,573,601 B2 | 6/2003 | Dennison et al. | |
| 6,617,253 B1 | 9/2003 | Chu et al. | |
| 6,617,254 B2 | 9/2003 | Lee et al. | |
| 6,689,696 B2 | 2/2004 | Lee et al. | |
| 6,762,127 B2 | 7/2004 | Boiteux et al. | |
| 6,812,150 B2 | 11/2004 | Zheng | |
| 6,838,384 B2 | 1/2005 | Kamijima | |
| 6,900,134 B1 | 5/2005 | Shih et al. | |
| 6,927,120 B2 | 8/2005 | Hsu et al. | |
| 7,030,024 B2 | 4/2006 | Ho et al. | |
| 2001/0046777 A1 | 11/2001 | Lee et al. | |
| 2001/0051436 A1 | 12/2001 | Kim | |
| 2002/0039840 A1 | 4/2002 | Watatani | |
| 2003/0176058 A1 | 9/2003 | Weidman et al. | |
| 2004/0043619 A1 | 3/2004 | Rhodes et al. | |
| 2006/0057852 A1 | 3/2006 | Fu et al. | |
| 2006/0199391 A1 | 9/2006 | Nakata | |
| 2006/0234511 A1 | 10/2006 | Ohuchi | |

OTHER PUBLICATIONS

IBM Technical Disclosure Bulletin, "Borderless Gate Contact—MO Local Interconnect Technology for Trench Gate MOSFETs" vol. 34, No. 11, pp. 251-254, Apr. 1992.

Kaanta et al., Dual Damascene: A ULSI Wiring Technology, VMIC Conference, pp. 144-152, Jun. 11-12, 1991.

Wolf, "Silicon Processing for the VLSI Era", vol. 2: Process Integration, pp. 51-54, 247-251, Lattice Press, Sunset Beach, California 1990.

IBM Technical Disclosure Bulletin, "Lithographic Patterns with a Barrier Liner", vol. 32, No. 10B, pp. 114-115, Mar. 1990.

Office Action (Reasons for Rejection) mailed Jan. 31, 1995, from Japanese Patent Office, for Japanese counterpart application No. 204434/93, with English translation and partial translation of cited references.

* cited by examiner

METHOD FOR AN INTEGRATED CIRCUIT CONTACT

CROSS-REFERENCE TO RELATED APPLICATIONS

This application is a divisional of application Ser. No. 10/136,544, filed May 1, 2002, pending, which is a continuation of application Ser. No. 09/569,578, filed May 10, 2000, now U.S. Pat. No. 6,414,392, issued Jul. 2, 2002, which is a divisional of application Ser. No. 09/099,047, filed Jun. 17, 1998, now U.S. Pat. No. 6,221,779, which is a continuation of application Ser. No. 08/786,482, filed Jan. 21, 1997, now U.S. Pat. No. 5,858,877, which is a continuation of application Ser. No. 08/626,651, filed Apr. 1, 1996, now U.S. Pat. No. 5,651,855, which is a continuation of application Ser. No. 08/259,187, filed Jun. 13, 1994, abandoned, which is a continuation-in-part of application Ser. No. 07/921,320 filed Jul. 28, 1992, abandoned.

BACKGROUND OF THE INVENTION

Field of the Invention

This invention relates generally to processes for manufacturing ultra large scale integrated circuits (ULSICs) and more particularly to a self-aligned process for simultaneously enhancing the achievable device packing density, device reliability and yields during such manufacture.

In the manufacture of ultra large scale integrated circuits, such as 4-megabit and up dynamic random access memories (DRAMs), it has been one prior art approach to use an inlaid, fully integrated wiring technology known in the integrated circuit manufacturing arts as "Dual Damascene" technology. This approach to ULSIC electrical contact development is described in some detail in Cronin, et al., U.S. Pat. No. 5,126,006 and in an article by Carter W. Kaanta, et al. entitled "Dual Damascene: A ULSIC Wiring Technology," IBM General Technology Division, Essex Junction, Vermont, VMIC Conference, Jun. 11–12, 1991, at pp. 144–152.

This Dual Damascene processing for etching troughs through insulating layers formed on silicon substrates utilizes, among other things, first and second successive etching steps in order to arrive at an ultimate trough and contact hole geometry within surrounding insulating layers formed on the surface of a silicon wafer. The first etch step forms the trough down to a controlled depth within the surface insulating layers. The second etch step extends the depth of the trough down to the active devices within the silicon substrate to form the contact hole. One disadvantage of using the above described Dual Damascene approach is that the photoresist etch mask required for the second etch step must be precisely aligned with respect to the trough opening formed by the first etch step. The requirement for precise alignment of the second etch mask imposes an upper threshold on the maximum achievable packing density, reliability and yields that can be reached using the above Dual Damascene process. In addition, present techniques do not allow the etch of the interconnect trough to be controlled independent of the etch of the stud or contact hole.

It is the solution to these problems to which the present invention is directed.

BRIEF SUMMARY OF THE INVENTION

In accordance with the present invention, it has been discovered that the above problem of precise second etch mask alignment with respect to the first formed trough opening can be significantly reduced by the employment of an etch stop layer on the surface of the insulating layer. The width dimension of an opening in the etch stop layer is made coextensive with the width dimension of the desired trough opening to be formed within the insulating layer. Then, the etch stop layer is used in combination with an etchant to define the trough opening within the insulating layer. Next, a photoresist etch mask is formed on the surface of the etch stop layer and has an opening therein defined by predetermined width and length dimensions dependent upon the desired trough geometry. However, since the photoresist mask is formed above the etch stop layer, the alignment of its width dimension is not now critical inasmuch as the etching action for increasing the depth of a portion of the trough to complete formation of the stud or contact hole is confined, or self-aligned, by the opening in the etch stop layer. Thus, as this second etching step of the insulating layer continues on to the silicon substrate surface, its width dimension remains constant. Also, because the interconnect trough is completely formed in the first etch, the trough can be and is masked during the second etch that forms the stud or contact hole. The etch that forms the contact hole can, therefore, be controlled independent of the etch that forms the trough.

Next, the photoresist mask is removed and the completed trough and contact hole are filled with a selected metal such as tungsten. Finally, and optionally, the etch stop layer can be either retained in place or removed and the tungsten layer is chemically and mechanically polished using known CMP processes back to a depth substantially coplanar with the surface of the etch stop layer when the etch stop layer is retained in place. Optionally, surface contact pads may be formed on top of the completed metal pattern. Also optionally, the etch stop layer removal step can be carried out prior to the tungsten deposition step, and blanket etching of metal can be used instead of CMP processes.

Accordingly, it is an object of the present invention to provide a new and improved self-aligning process for making electrical contacts in the manufacture of high density integrated circuits.

Another object of this invention is to provide a new and improved process of the type described which represents a novel alternative with respect to the above described Dual Damascene process.

Another object of this invention is to provide a new and improved process of the type described which operates to increase maximum achievable device packing density in the manufacture of integrated circuits.

Another object of this invention is to provide a new and improved electrical contact-forming process of the type described which enhances device reliability and device yields.

Another object of this invention is to provide a new and improved process of the type described which may be repeated through a plurality of stacked dielectric layers such as $SiO_2$ to thereby form a multilevel metal integrated circuit.

Briefly summarized, and commensurate in scope with the broad claims filed herein, the present process of forming electrical contacts in the manufacture of integrated circuits includes the steps of: forming an insulating layer on the surface of a silicon substrate; forming an etch stop layer on the surface of the insulating layer; forming an opening in the etch stop layer; etching through the opening to a first trough depth into the insulating layer exposed by the opening in the etch stop layer; forming a photoresist etch mask on the surface of the etch stop layer and in a portion of the trough;

continuing to etch the exposed portion of the insulating layer until reaching the surface of the silicon substrate to thereby form the contact or stud hole; removing the photoresist mask; and filling the trough and hole thus formed with a selected metal such as tungsten. In a preferred embodiment of the invention, chemical-mechanical polishing processes are used to remove a portion of the selected metal back to a depth coplanar with the surface of the etch stop layer or surface of the insulating layer.

The above brief summary of the invention, together with its attendant objects, advantages and novel features will become better understood with reference to the following description of the accompanying drawings.

DETAILED DESCRIPTION OF THE INVENTION

Figure 1:
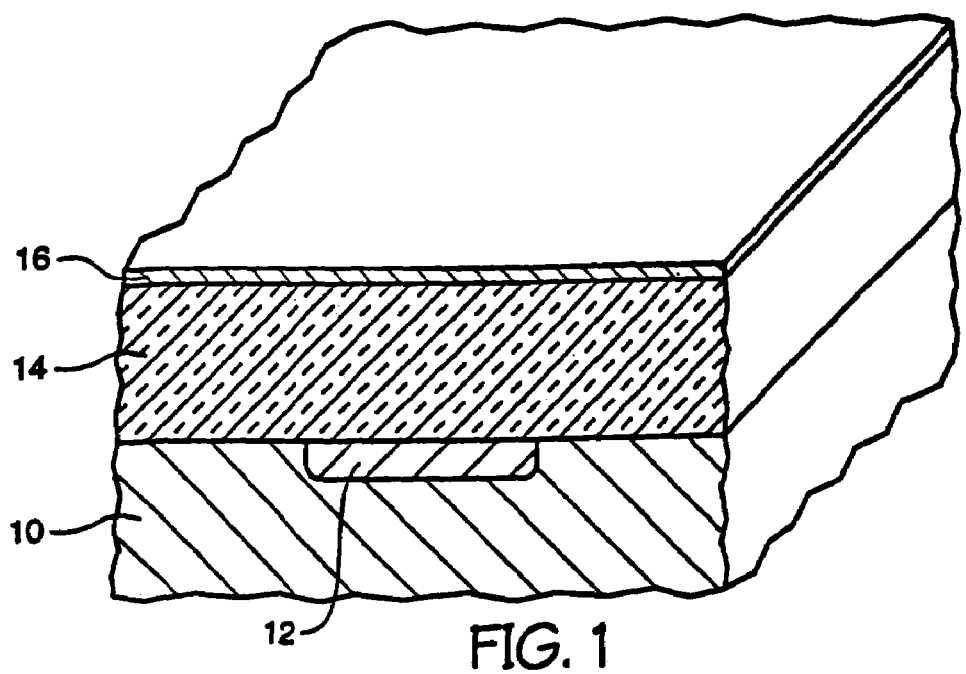
FIGS. 1 through 10 are a series of schematic cross-section diagrams illustrating the sequence of process steps used in a preferred process embodiment of the invention.

Referring now to FIG. 1, there is shown a silicon substrate 10 in which one or more active device regions 12 have been formed using conventional diffusion or ion implantation doping techniques together with conventional photolithographic masking and etching procedures. Typically, a relatively insulating layer 14, preferably made of silicon dioxide, will be formed on the surface of the silicon substrate 10 using low temperature chemical vapor deposition processes and preferably a known tetraethylorthosilicate (TEOS) process. Next, a thin etch stop layer 16 is formed to a thickness of about 500–1000 angstroms on the surface of the insulating layer 14. Etch stop layer 16 may be made of any suitable material such as silicon nitride, $Si_3N_4$, or titanium oxide, TiO, or aluminum oxide, $Al_2O_3$.

Figure 2:
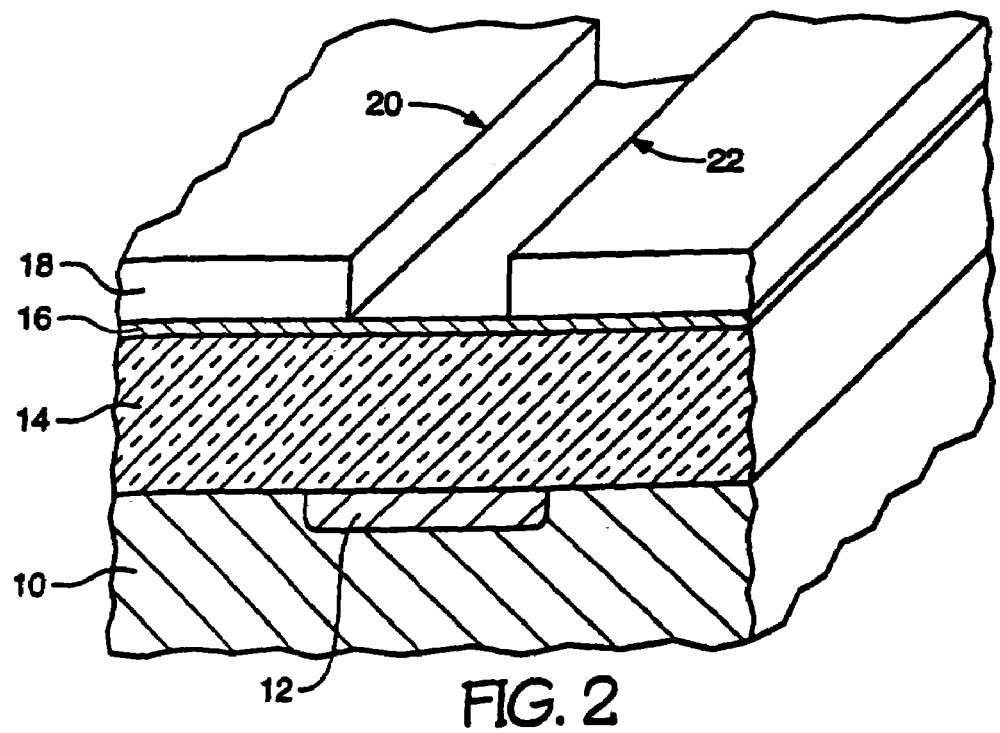
Figure 3:
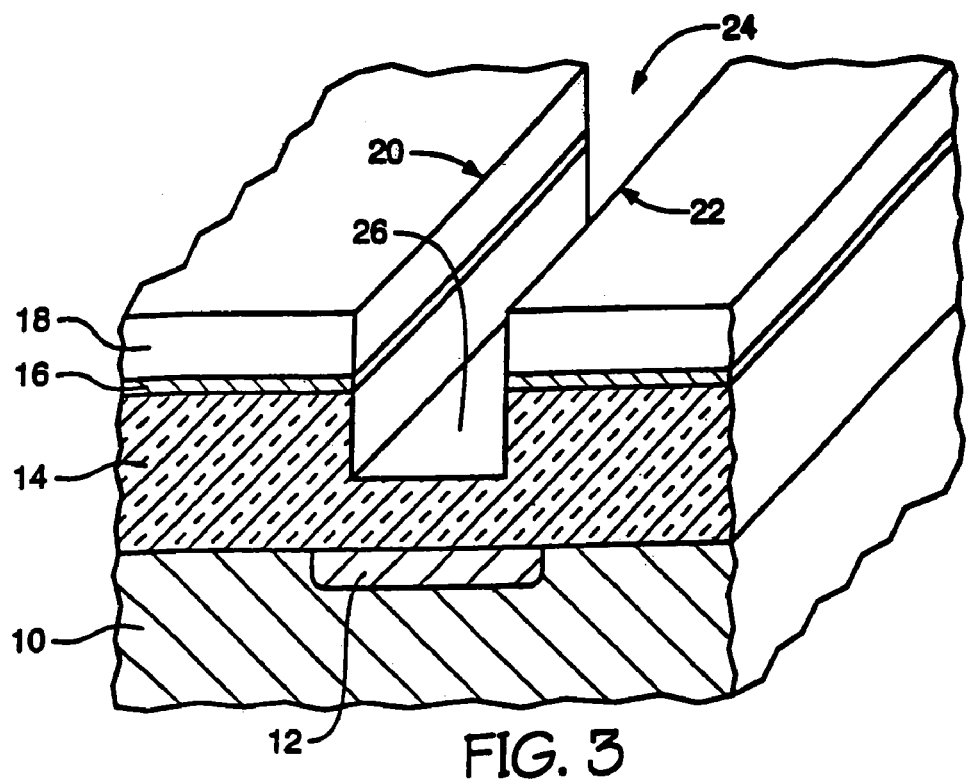
Figure 4:
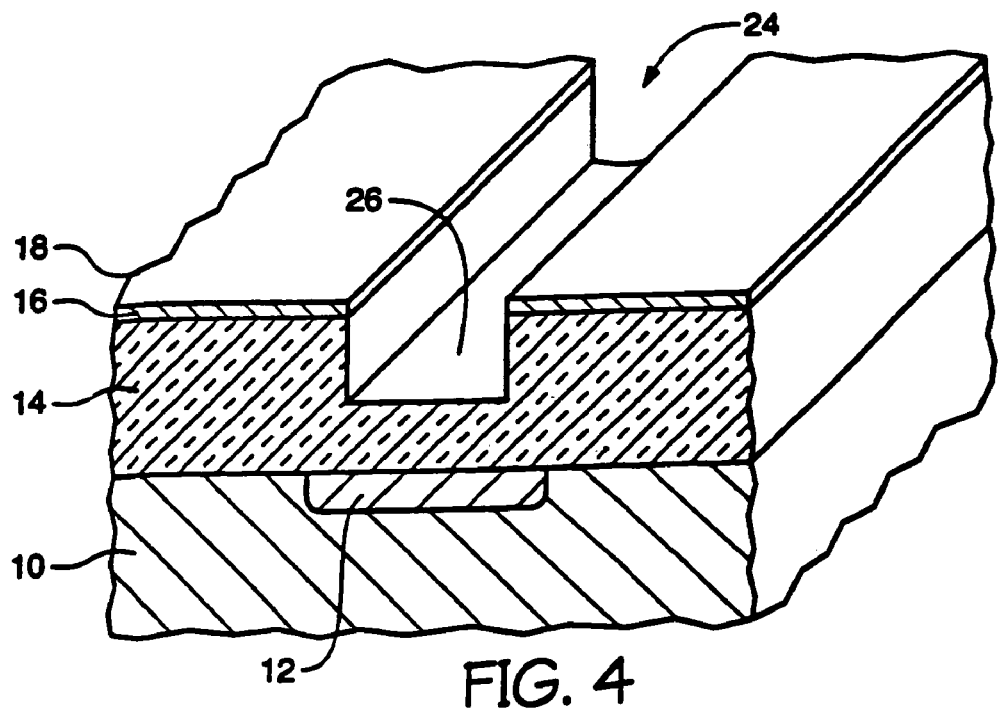

An opening is then formed in etch stop layer 16 to expose portions of insulating layer 14 at locations of desired trough patterns. In the preferred embodiment, and referring now to FIG. 2, a first photoresist mask 18 is formed on the surface of the etch stop layer 16, and an opening 20 is formed in the first photoresist mask 18 using conventional photolithographic masking and etching procedures in order to expose a given area 22 of the etch stop layer 16. Then, as shown in FIG. 3, an opening 24 is first etched in the etch stop layer 16 using an etchant such as $CHF_3$ and $CF_4$, and the first photoresist mask 18 in FIG. 3 may be left in place during etching down to a first desired depth to form trough 26 within the insulating layer 14. Once the trough 26 depth has been reached, then the first photoresist mask 18 in FIG. 3 is removed as shown in FIG. 4. The etch stop layer 16 of either silicon nitride, titanium oxide, aluminum oxide or other equivalent dense inorganic insulating material will be quite suitable to serve as an etch mask during the etching of the insulating layer 14 in the geometry shown in FIGS. 3 and 4.

Figure 5:
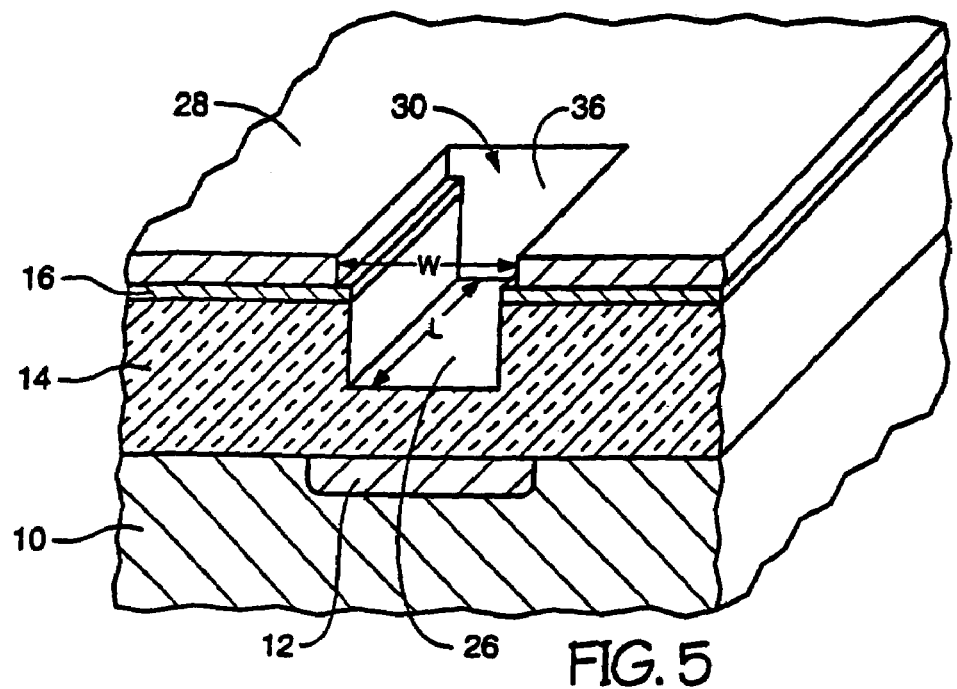
Figure 6:
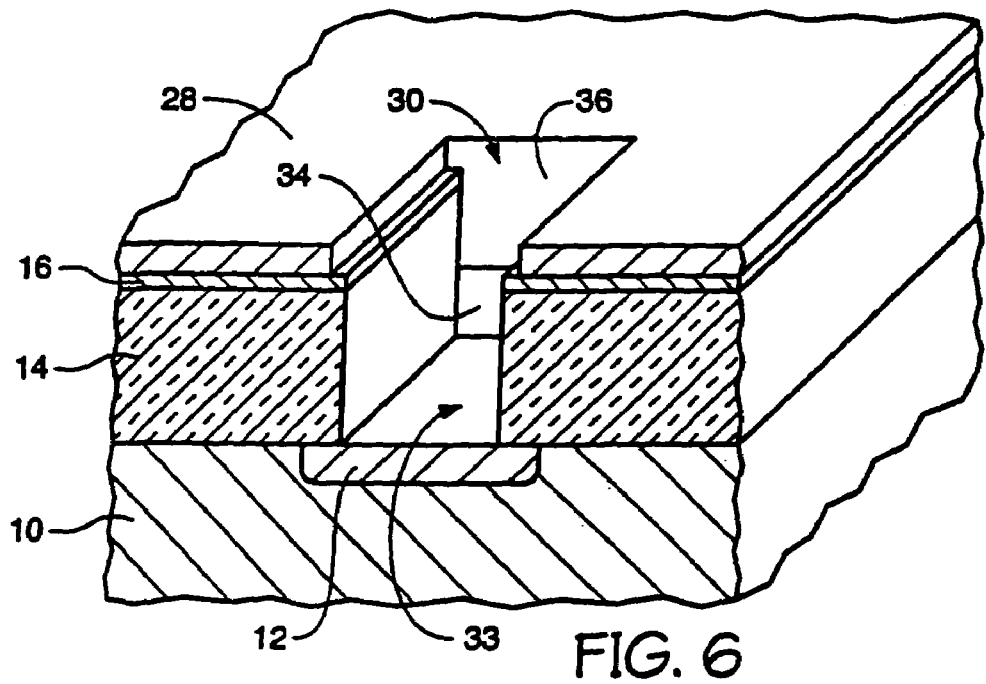

Referring now to FIG. 5, a second photoresist mask 28 having an opening 30 therein is formed on the surface of the etch stop layer 16. This second photoresist mask 28 will serve to mask against etching carried out using state of the art reactive ion etching (RIE) techniques. Opening 30 in second photoresist mask 28 has a width dimension, W, and need not be precisely aligned with the corresponding width dimension of the trough 26 opening because, during this etching process, etch stop layer 16 will serve to mask against the vertical ion bombardment except in the region of the trough 26. Such ion bombardment and etching will continue etching through the $SiO_2$ insulating layer 14 until reaching the active device region 12 to thereby produce the contact hole 33 indicated in FIG. 6. As seen in FIG. 6, the length dimension of the contact hole 33 extends to a back wall 34 of the insulating layer 14, and this back wall 34 is aligned with the back wall 36 of the second photoresist mask 28.

Figure 7:
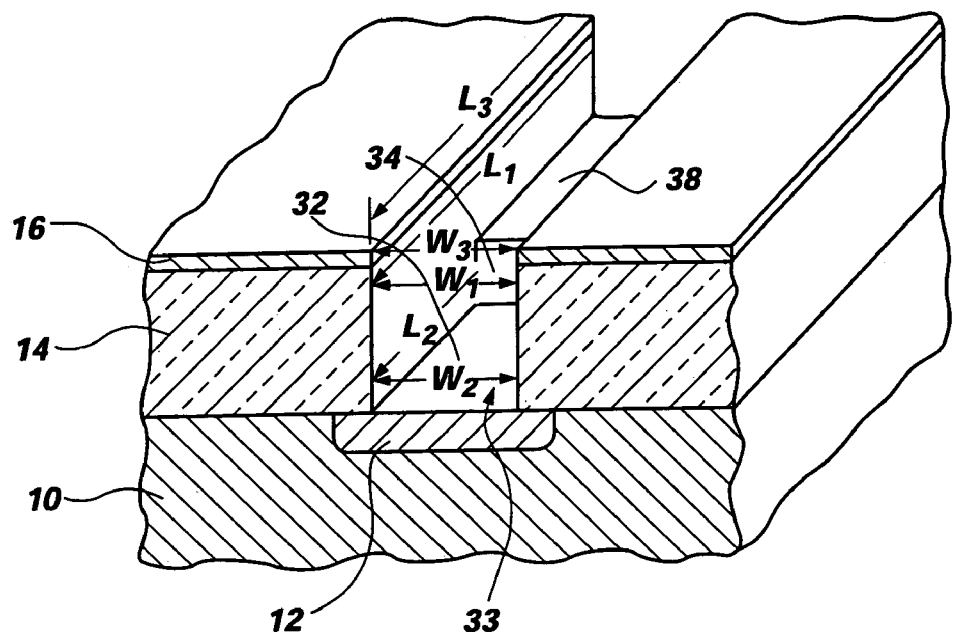

Referring now to FIG. 7, the second photoresist mask 28 in FIG. 6 has been removed to show the completed trough and hole geometry consisting of a first depth at the top wall 38 which extends into the device structure of FIG. 7 along the length of the top wall 38 and the second greater depth at exposed surface 32. There is no criticality of mask alignment of the width dimension W of the second photoresist mask 28 with the width dimension of the vertical trough 26 being etched. However, the alignment of the contact hole 33 length dimension as defined by the back wall 36 of the second photoresist mask 28 in FIG. 6 still remains critical to defining the precisely desired device geometries for the integrated circuits being manufactured. It should be noted that, as illustrated, the insulating layer 14 has a first opening having a first length $L_1$ and a first width $W_1$, a second opening connected to the first opening located therebelow having a second length $L_2$ which is less than the length $L_1$ and a second width $W_2$ which is one of at least equal to the first width $W_1$ of the first opening and greater than the first width $W_1$ of the first opening. Further, the etch stop layer 16 located over the insulating layer 14 has a third opening which is located above the first opening in the insulating layer 14 and connected to the first opening having third length $L_3$ at least equal to the first length $L_1$ of the first opening in the insulating layer 14 and a third width $W_3$ being one of at least equal to the first width $W_1$ of the first opening of the insulating layer 14 and greater than the first width $W_1$ of the first opening in the insulating layer 14.

Figure 8:
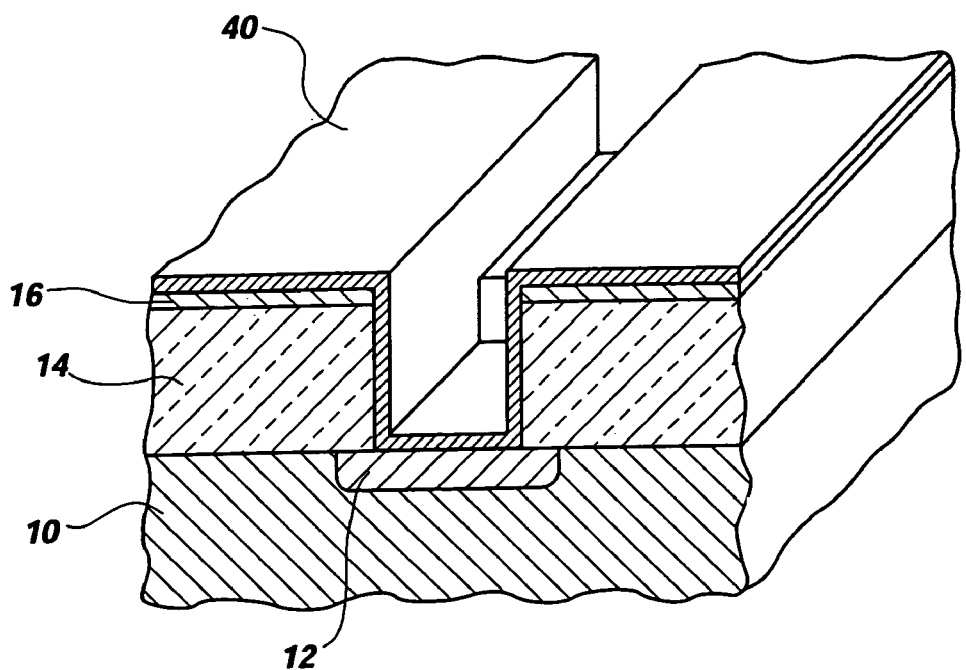
Figure 9:
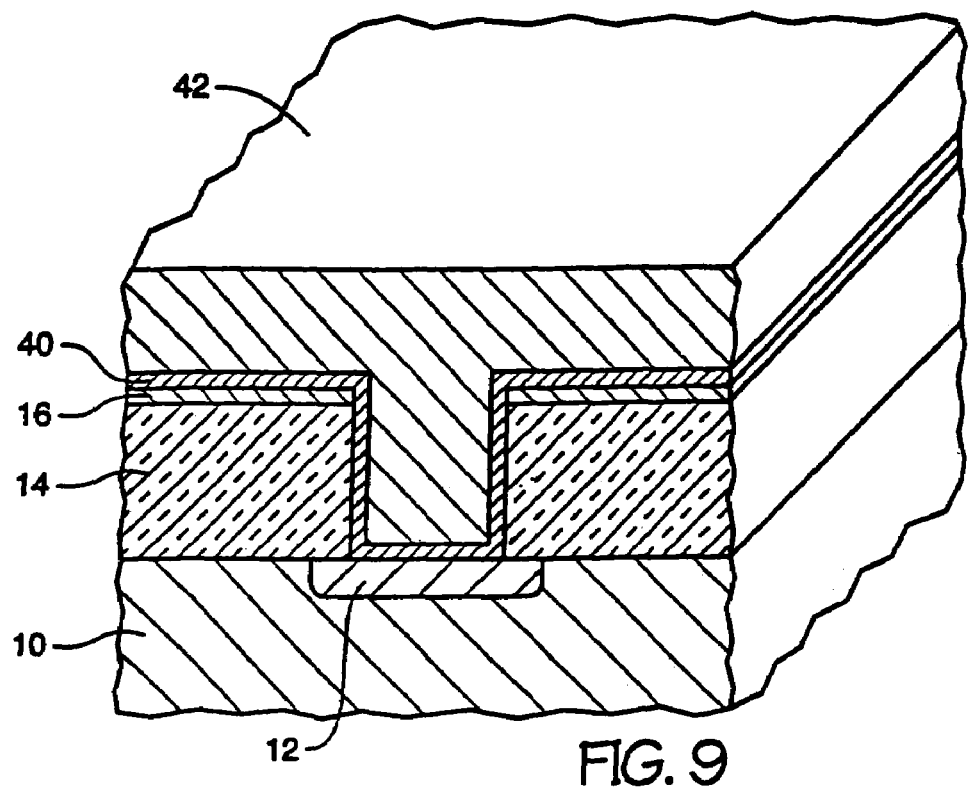
Figure 10:
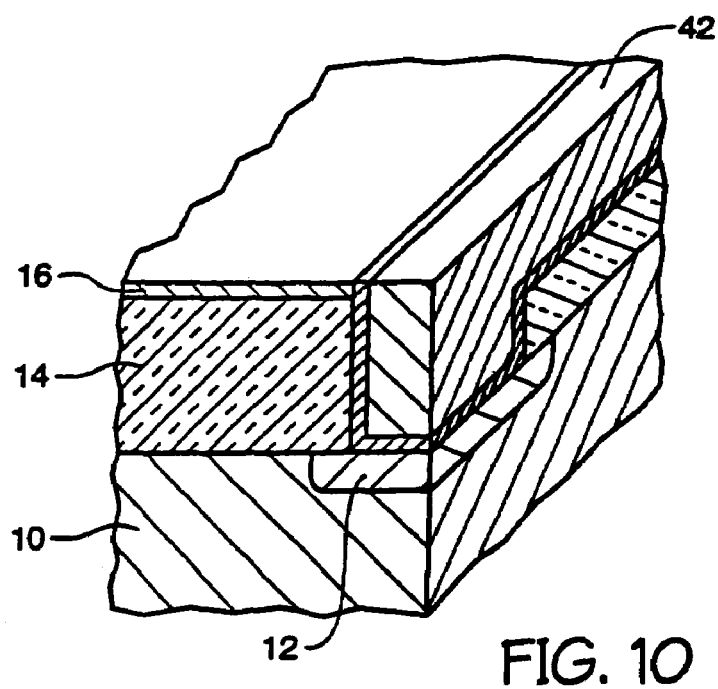

Referring now to FIG. 8, the exposed surface 32 and top wall 38 in FIG. 7 and the top surfaces of the etch stop layer 16 are covered with adhesion layer 40, and then as shown in FIG. 9, a metal layer 42 is deposited on the outer surface of the adhesion layer 40. This metal layer 42 will preferably be tungsten, copper or silver which is laid down using conventional metal deposition processes. Adhesion layer 40, preferably made of titanium nitride, is sputter deposited on insulating layer 14 and etch stop layer 16 to improve bonding with metal layer 42. Frequently, it will be desired to then polish or etch back metal layer 42 so that the ultimate top surface of the selected metal layer 42 is coplanar with the top surface of the etch stop layer 16 as shown in FIG. 10.

Optionally, the etch stop layer 16 can be used as a mask during etching of the metal layer 42 so that the metal layer 42 can be etched through opening 24 in etch stop layer 16 down to and coplanar with the top surface of insulating layer 14. Etch stop layer 16 would then be removed. The etch stop layer 16 may also be removed prior to forming the adhesion and metal layers 40 and 42, respectively. Also optionally, surface contact pads or interconnects (not shown) may be made on top of or leading into the planarized metallization-filled troughs described above.

Various modifications may be made in and to the above described embodiment without departing from the spirit and scope of this invention. For example, the present invention is in no way limited by the particular materials or layer thicknesses described above which are only exemplary of certain typical materials and layer thicknesses used in existing ULSIC semiconductor fabrication processes. In addition, the etch stop layer may be either removed or retained in place after the vertical trough-forming process has been completed. Furthermore, the present invention is not limited to the electrical interconnection through a single layer of dielectric material, e.g., SiO$_2$, as shown in FIG. 10 and may instead be used in various types of multilevel metallization processes such as those shown, for example, in co-pending application Ser. No. 07/775,744, U.S. Pat. No. 5,204,286 of Trung T. Doan entitled "Method of Making Self-Aligned Contacts and Vertical Interconnects to Integrated Circuits and Devices Made Thereby," filed Oct. 15, 1991, assigned to the present assignee and incorporated herein by reference. Accordingly, these and other process and device modifications are clearly within the scope of the following appended claims.

What is claimed is:

1. A method for controlling an etching process, comprising:
    using a first resist mask to pattern at least a portion of an etch stop layer and an insulation layer during at least one etching process; and
    using the etch stop and a second resist mask to further pattern a portion of the insulation layer during the etching process, the first resist mask, the etch stop and the second resist mask forming a first opening having a first length and a first width, and having a second opening connected to said first opening while being located therebelow, said second opening having a second length less than said first length of said first opening and having a second width equal to said first width of said first opening, said first etch mask acting as an etch stop layer defining a third width of a third opening located above said first opening and connected to said first opening, said third opening having a third length equal to said first length of said first opening and said third width equal to said second width of said second opening.

2. The method in claim 1, wherein:
    using the first resist mask to pattern the etch stop comprises using the first resist mask during a first etch step;
    using the first resist mask to pattern the insulation layer comprises using the first resist mask during a second etch step; and
    using the etch stop and the second resist mask comprises using the etch stop and the second resist mask during a third etch step.

3. The method in claim 2, wherein using the etch stop and the second resist mask during the third etch step comprises using the etch stop and the second resist mask during a reactive ion etch.

4. A method for processing a portion of a semiconductor circuit including an insulator, comprising:
    providing an etch stop as part of the semiconductor circuit portion, the etch stop overlying the insulator;
    patterning the etch stop using a first resist mask;
    patterning the insulator using the first resist mask; and
    further patterning the insulator with the etch stop and a second resist mask, the first resist mask, the etch stop and the second resist mask forming a first opening having a first length and a first width, and having a second opening connected to said first opening while being located therebelow, said second opening having a second length less than said first length of said first opening and having a second width equal to said first width of said first opening, said first etch mask acting as an etch stop layer defining a third width of a third opening located above said first opening and connected to said first opening, said third opening having a third length equal to said first length of said first opening and said third width equal to said second width of said second opening.

5. The method in claim 4, wherein providing the etch stop as part of the semiconductor circuit portion comprises providing the etch stop as a permanent part of the semiconductor circuit portion.

6. A method for controlling an etching process, comprising:
    using a first resist mask to pattern an etch stop layer and an insulation layer during at least one etching process; and
    using the etch stop and a second resist mask to further pattern the insulation layer during the etching process, the first resist mask, the etch stop and the second resist mask forming a first opening having a first length and a first width, and having a second opening connected to said first opening while being located therebelow, said second opening having a second length less than said first length of said first opening and having a second width equal to said first width of said first opening, said first etch mask acting as an etch stop layer defining a third width of a third opening located above said first opening and connected to said first opening, said third opening having a third length equal to said first length of said first opening and said third width equal to said second width of said second opening.

7. The method in claim 6, wherein:
    using the first resist mask to pattern the etch stop comprises using the first resist mask during a first etch step;
    using the first resist mask to pattern the insulation layer comprises using the first resist mask during a second etch step; and
    using the etch stop and the second resist mask comprises using the etch stop and the second resist mask during a third etch step.

8. The method in claim 7, wherein using the etch stop and the second resist mask during the third etch step comprises using the etch stop and the second resist mask during a reactive ion etch.

9. A method for processing a portion of a semiconductor circuit having an insulator, comprising:
    providing an etch stop as part of the semiconductor circuit portion, the etch stop overlying the insulator;
    patterning the etch stop using a first resist mask;
    patterning the insulator using the first resist mask; and
    further patterning the insulator with the etch stop and a second resist mask, the first resist mask,
    the etch stop and the second resist mask forming a first opening having a first length and
    a first width, and having a second opening connected to said first opening while being located therebelow, said second opening having a second length less than said first length of said first opening and having a second width equal to said first width of said first opening, said first etch mask acting as an etch stop layer defining a third width of a third opening located above said first opening and connected to said first opening, said third opening having a third length equal to said first length of said first opening and said third width equal to said second width of said second opening.

10. The method in claim 9, wherein providing the etch stop as part of the semiconductor circuit portion comprises providing the etch stop as a permanent part of the semiconductor circuit portion.

11. A method for performing an etching process, comprising:

using a first resist mask to pattern a portion of an etch stop layer and an insulation layer during at least one etching process; and using the etch stop and a second resist mask to further pattern the insulation layer during the etching process, the first resist mask, the etch stop and the second resist mask forming a first opening having a first length and a first width, and having a second opening connected to said first opening while being located therebelow, said second opening having a second length less than said first length of said first opening and having a second width equal to said first width of said first opening, said first etch mask acting as an etch stop layer defining a third width of a third opening located above said first opening and connected to said first opening, said third opening having a third length equal to said first length of said first opening and said third width equal to said second width of said second opening.

12. The method in claim 11, wherein:

using the first resist mask to pattern the etch stop comprises using the first resist mask during a first etch step;

using the first resist mask to pattern the insulation layer comprises using the first resist mask during a second etch step; and using the etch stop and the second resist mask comprises using the etch stop and the second resist mask during a third etch step.

13. The method in claim 12, wherein using the etch stop and the second resist mask during the third etch step comprises using the etch stop and the second resist mask during a reactive ion etch.

14. A method in a process for controlling etching of a portion of a semiconductor circuit having an insulator, comprising:

providing an etch stop as part of the semiconductor circuit portion, the etch stop overlying the insulator;

patterning the etch stop using a first resist mask;

patterning the insulator using the first resist mask; and further patterning the insulator with the etch stop and a second resist mask, the first resist mask, the etch stop and the second resist mask forming a first opening having a first length and a first width, and having a second opening connected to said first opening while being located therebelow, said second opening having a second length less than said first length of said first opening and having a second width equal to said first width of said first opening, said first etch mask acting as an etch stop layer defining a third width of a third opening located above said first opening and connected to said first opening, said third opening having a third length equal to said first length of said first opening and said third width equal to said second width of said second opening.

15. The method in claim 14, wherein providing the etch stop as part of the semiconductor circuit portion comprises providing the etch stop as a permanent part of the semiconductor circuit portion.

16. A method for limiting an etching process, comprising:

using a first resist mask to pattern an etch stop during the etching process;

using the first resist mask to pattern an insulation layer during another etching process; and using the etch stop and a second resist mask to further pattern the insulation layer during the etching process, the first resist mask, the etch stop and the second resist mask forming a first opening having a first length and a first width, and having a second opening connected to said first opening while being located therebelow, said second opening having a second length less than said first length of said first opening and having a second width equal to said first width of said first opening, said first etch mask acting as an etch stop layer defining a third width of a third opening located above said first opening and connected to said first opening, said third opening having a third length equal to said first length of said first opening and said third width equal to said second width of said second opening.

17. The method in claim 16, wherein:

using the first resist mask to pattern the etch stop comprises using the first resist mask during a first etch step;

using the first resist mask to pattern the insulation layer comprises using the first resist mask during a second etch step; and using the etch stop and the second resist mask comprises using the etch stop and the second resist mask during a third etch step.

18. The method in claim 17, wherein using the etch stop and the second resist mask during the third etch step comprises using the etch stop and the second resist mask during a reactive ion etch.

19. A method for processing a portion of a semiconductor circuit having an insulator for controlling etching thereof, comprising:

providing an etch stop as part of the semiconductor circuit portion, the etch stop overlying the insulator;

patterning the etch stop using a first resist mask;

patterning the insulator using the first resist mask; and further patterning the insulator with the etch stop and a second resist mask, the first resist mask, the etch stop and the second resist mask forming a first opening having a first length and a first width, and having a second opening connected to said first opening while being located therebelow, said second opening having a second length less than said first length of said first opening and having a second width equal to said first width of said first opening, said first etch mask acting as an etch stop layer defining a third width of a third opening located above said first opening and connected to said first opening, said third opening having a third length equal to said first length of said first opening and said third width equal to said second width of said second opening.

20. The method in claim 19, wherein providing the etch stop as part of the semiconductor circuit portion comprises providing the etch stop as a permanent part of the semiconductor circuit portion.

* * * * *